US010303919B2

(12) United States Patent
Mienko et al.

(10) Patent No.: US 10,303,919 B2
(45) Date of Patent: May 28, 2019

(54) DISPLAY INTEGRATED OPTICAL FINGERPRINT SENSOR WITH ANGLE LIMITING REFLECTOR

(71) Applicant: Synaptics Incorporated, San Jose, CA (US)

(72) Inventors: Marek Mienko, San Jose, CA (US); Patrick Smith, San Jose, CA (US); Arash Akhavan Fomani, Saratoga, CA (US); Jeffrey A. Small, Rochester, NY (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 15/944,591

(22) Filed: Apr. 3, 2018

(65) Prior Publication Data
US 2018/0225501 A1 Aug. 9, 2018

Related U.S. Application Data

(63) Continuation of application No. 15/087,785, filed on Mar. 31, 2016, now Pat. No. 9,934,418.
(Continued)

(51) Int. Cl.
*G06K 9/00* (2006.01)
*G06F 3/042* (2006.01)
(Continued)

(52) U.S. Cl.
CPC .......... *G06K 9/0004* (2013.01); *G06F 3/0421* (2013.01); *G06K 9/0008* (2013.01);
(Continued)

(58) Field of Classification Search
CPC ........ G06F 3/0421; G06F 2203/04109; G06K 9/00073; G06K 9/0008; H01L 27/14623;
(Continued)

(56) References Cited

U.S. PATENT DOCUMENTS 5,625,448 A * 4/1997 Ranalli .............. G06K 9/00026
356/71
7,969,422 B2 6/2011 Gruhlke
(Continued)

FOREIGN PATENT DOCUMENTS

KR 1020040034776 A 4/2004

OTHER PUBLICATIONS

International Search Report and Written Opinion issued in PCT/US2016/064174 dated Feb. 13, 2017.
(Continued)

*Primary Examiner* — Peter Bradford
(74) *Attorney, Agent, or Firm* — Leydig, Voit & Mayer, Ltd.

(57) ABSTRACT

An optical sensor for imaging an input object, such as a fingerprint, on a sensing region of a display is disclosed. The sensor includes a transparent substrate having a first side and a second side opposite the first side. An array of detector elements is positioned above the first side of the transparent substrate and an angle limiting reflector is positioned below the second side of the transparent substrate. The angle limiting reflector is configured to reflect light incident on the angle limiting reflector within a limited acceptance angle towards the array detector elements.

20 Claims, 8 Drawing Sheets

Related U.S. Application Data

(60) Provisional application No. 62/262,894, filed on Dec. 3, 2015.

(51) Int. Cl.
*H01L 27/146* (2006.01)
*H01L 27/32* (2006.01)
*H01L 31/0236* (2006.01)
*H01L 51/56* (2006.01)

(52) U.S. Cl.
CPC .... *G06K 9/00073* (2013.01); *H01L 27/14623* (2013.01); *H01L 27/14629* (2013.01); *H01L 27/14685* (2013.01); *H01L 27/3234* (2013.01); *H01L 31/0236* (2013.01); *H01L 51/56* (2013.01); *G06F 2203/04109* (2013.01)

(58) Field of Classification Search
CPC ......... H01L 27/14629; H01L 27/14685; H01L 27/3234; H01L 31/0236; H01L 51/56
See application file for complete search history.

(56) References Cited

U.S. PATENT DOCUMENTS

| | | | |
|---|---|---|---|
| 8,487,913 B2 | 7/2013 | Tsuda | |
| 9,829,614 B2 | 11/2017 | Smith et al. | |
| 9,934,418 B2 | 4/2018 | Mienko et al. | |
| 10,019,615 B2 | 7/2018 | Wu | |
| 2001/0050765 A1* | 12/2001 | Antonelli | G06K 9/00026 356/71 |
| 2005/0157914 A1 | 7/2005 | Kim et al. | |
| 2005/0243055 A1* | 11/2005 | Ranta | G06F 3/0421 345/156 |
| 2007/0222998 A1 | 9/2007 | Sasaki et al. | |
| 2008/0025579 A1 | 1/2008 | Sidlauskas et al. | |
| 2008/0122803 A1* | 5/2008 | Izadi | G06F 3/0421 345/175 |
| 2012/0133624 A1* | 5/2012 | Castagner | G06F 3/0421 345/207 |
| 2012/0241825 A1 | 9/2012 | Aishi | |
| 2014/0354596 A1 | 12/2014 | Djordjev et al. | |
| 2015/0036065 A1* | 2/2015 | Yousefpor | G06K 9/228 349/12 |
| 2015/0242056 A1* | 8/2015 | Hoffman | G06F 3/0428 345/175 |
| 2017/0017824 A1 | 1/2017 | Smith et al. | |
| 2017/0161544 A1 | 6/2017 | Fomani et al. | |
| 2017/0220838 A1 | 8/2017 | He et al. | |
| 2017/0220844 A1 | 8/2017 | Jones et al. | |

OTHER PUBLICATIONS

International Search Report and Written Opinion issued in PCT/US2016/064148 dated Feb. 14, 2017.

* cited by examiner

DISPLAY INTEGRATED OPTICAL FINGERPRINT SENSOR WITH ANGLE LIMITING REFLECTOR

CROSS REFERENCE TO RELATED APPLICATIONS

This application is a continuation of U.S. patent application Ser. No. 15/087,785, filed on Mar. 31, 2016, which claims the benefit of U.S. Provisional Patent Application Ser. No. 62/262,894, filed on Dec. 3, 2015. The entire contents of each of the aforementioned applications is expressly incorporated by reference.

This application is further related to U.S. patent application Ser. No. 15/087,955 entitled "Optical Sensor for Integration in a Display" and U.S. patent application Ser. No. 15/087,971 entitled "Optical Sensor for Integration Over a Display Backplane," both filed on Mar. 31, 2016, the entire contents of which are expressly incorporated by reference.

FIELD

This disclosure generally relates to optical sensors, and more particularly to an optical sensor which may be integrated with a display stack.

BACKGROUND

Object imaging is useful in a variety of applications. By way of example, biometric recognition systems image biometric objects for authenticating and/or verifying users of devices incorporating the recognition systems. Biometric imaging provides a reliable, non-intrusive way to verify individual identity for recognition purposes. Various types of sensors may be used for biometric imaging.

Fingerprints, like various other biometric characteristics, are based on distinctive personal characteristics and thus provide a reliable mechanism to recognize an individual. Thus, fingerprint sensors have many potential applications. For example, fingerprint sensors may be used to provide access control in stationary applications, such as security checkpoints. Fingerprint sensors may also be used to provide access control in mobile devices, such as cell phones, wearable smart devices (e.g., smart watches and activity trackers), tablet computers, personal data assistants (PDAs), navigation devices, and portable gaming devices. Accordingly, some applications, in particular applications related to mobile devices, may require recognition systems that are both small in size and highly reliable.

Most commercially available fingerprint sensors are based on optical or capacitive sensing technologies. Most mobile devices have capacitive sensors with a sensing array configured to sense ridge and valley features of a fingerprint. Typically, these fingerprint sensors either detect absolute capacitance (sometimes known as "self-capacitance") or trans-capacitance (sometimes known as "mutual capacitance"). In either case, capacitance at each sensing element in the array varies depending on whether a ridge or valley is present, and these variations are electrically detected to form an image of the fingerprint.

While capacitive fingerprint sensors provide certain advantages, most commercially available capacitive fingerprint sensors have difficulty sensing fine ridge and valley features through large distances, requiring the fingerprint to contact a sensing surface that is close to the sensing array. It remains a significant challenge for a capacitive sensor to detect fingerprints through thick layers, such as the thick cover glass (sometimes referred to herein as a "cover lens") that protects the display of many smart phones and other mobile devices. To address this issue, a cutout is often formed in the cover glass in an area beside the display, and a discrete capacitive fingerprint sensor (often integrated with a mechanical button) is placed in the cutout area so that it can detect fingerprints without having to sense through the cover glass. The need for a cutout makes it difficult to form a flush surface on the face of device, detracting from the user experience, and complicating the manufacture. The hole in the device enclosure also can allow moisture or contaminants to enter the device. The existence of mechanical buttons also takes up valuable device real estate.

Solutions using optical fingerprint sensors usually require an optical element to condition light before the light reaches the sensor elements. Conventional optical elements often cannot fit within the limited height available in relatively small spaces, such as found in a display stack of an electronic device.

SUMMARY

One embodiment of the disclosure provides an optical sensor for imaging a biometric input object on a sensing region. The optical sensor includes a transparent substrate having a first side and a second side opposite the first side; an array of detector elements positioned above the first side of the transparent substrate; and an angle limiting reflector positioned below the second side of the transparent substrate, the angle limiting reflector configured to reflect light incident on the angle limiting reflector within a limited acceptance angle towards the array detector elements.

Another embodiment of the disclosure provides a display for imaging a biometric input object. The display includes a transparent substrate having a first side and a second side opposite the first side; a set of display elements positioned above the first side of the transparent substrate; an array of detector elements positioned above the first side of the transparent substrate; and an angle limiting reflector positioned below the second side of the transparent substrate, the angle limiting reflector configured to reflect light incident on the angle limiting reflector within a limited acceptance angle towards the array of detector elements.

Another embodiment of the disclosure provides a method for making an optical fingerprint sensor. The method includes forming an array of detector elements above a first side of a display substrate, wherein the display substrate is made of a transparent material; and forming an angle limiting reflector below a second side of the display substrate opposite to the first side of the display substrate.

DETAILED DESCRIPTION

The following detailed description is exemplary in nature and is not intended to limit the disclosure or the application and uses of the disclosure. Furthermore, there is no intention to be bound by any expressed or implied theory presented in the preceding field, background, summary, brief description of the drawings, or the following detailed description.

Turning to the drawings, and as described in greater detail herein, embodiments of the disclosure provide systems and methods to optically image an input object such as a fingerprint. In particular, a system and method are described for limiting angular subtend of reflected light. The embodiments include an angle selective reflector. Combined with detector elements and readout circuitry, the system and method are suitable for integrating a sensor for imaging an input object, such as a finger print sensors, with a display, such as for example a LED or OLED display. The angle selective reflector serves as an optical element which limits a field of view of the input object to be imaged as seen by individual detector elements. The angle selective reflector can be fabricated in multiple ways, e.g., by stacking a separate reflective element and separate absorbing baffle layer or manufactured as one piece using standard semiconductor or molding processes and simple metallization step.

The system and method can provide a cost effective add-on component, which need not alter the display manufacturing process and can be manufactured using lamination or attachment during final product assembly without special alignment. Components of the sensor, such as a reflector, can be made relatively thin in a sheet or roll format and later die cut to cover the entire or only a portion of an area of the display. The system and method can also provide added flexibility of further defining/adjusting the optical path between detector elements and input object (e.g., finger) by an addition of simple aperture in a display substrate.

Figure 1:
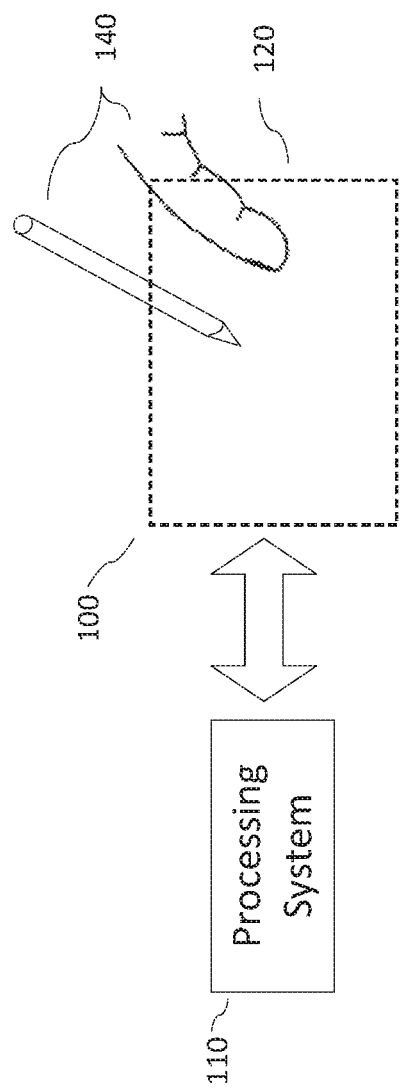
FIG. 1 is a block diagram of an example of a sensing system.

FIG. 1 is a block diagram of an exemplary sensing system having a sensor 100, in accordance with embodiments of the disclosure. The sensor 100 may be configured to provide input to an electronic system (also "electronic device"). Some non-limiting examples of electronic systems include personal computers of all sizes and shapes, such as desktop computers, laptop computers, netbook computers, tablets, e-book readers, personal digital assistants (PDAs), and wearable computers (such as smart watches and activity tracker devices). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The sensor 100 can be implemented as a physical part of the electronic system, or can be physically separate from the electronic system. In accordance with the disclosure, the sensor 100 may be integrated as part of a display of an electronic device. As appropriate, the sensor 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

The sensor 100 is configured to sense input provided by one or more input objects 140 in a sensing region 120. In one embodiment, the input object 140 is a finger, and the sensor 100 is implemented as a fingerprint sensor (also "fingerprint scanner") configured to detect fingerprint features of the input object 140. In other embodiments, the sensor 100 may be implemented as vascular sensor (e.g., for finger vein recognition), hand geometry sensor, or a proximity sensor (such as a touch pad, touch screen, and or other touch sensor device).

Sensing region 120 encompasses any space above, around, in, and/or near the sensor 100 in which the sensor 100 is able to detect input (e.g., user input provided by one or more input objects 140). The sizes, shapes, and locations of particular sensing regions may vary widely from embodiment to embodiment. In some embodiments, the sensing region 120 extends from a surface of the sensor 100 in one or more directions into space. In various embodiments, input surfaces may be provided by surfaces of casings within which sensor elements reside, by face sheets applied over the sensor elements or any casings, etc. In some embodiments, the sensing region 120 has a rectangular shape when projected onto an input surface of the input device 100.

The sensor 100 may utilize any combination of sensor components and sensing technologies to detect user input in the sensing region 120. The sensor 100 comprises one or more detector elements (or "sensing elements") for detecting user input. Some implementations utilize arrays or other regular or irregular patterns of sensing elements to detect the input object 140.

In the optical implementations of the input device 100 set forth in this disclosure, one or more detector elements detect light from the sensing region. In various embodiments, the detected light may be reflected from input objects in the sensing region, emitted by input objects in the sensing region, or some combination thereof. Example optical detector elements include photodiodes, CMOS arrays, CCD arrays, photodiodes, and other types of photosensors configured to detect light in the visible or invisible spectrum (such as infrared or ultraviolet light). The photosensors may be thin film transistors (TFTs) OR thin film diodes (TFDs).

Some optical implementations provide illumination to the sensing region. Reflections from the sensing region in the illumination wavelength(s) are detected to determine input information corresponding to the input object.

Some optical implementations rely on principles of direct illumination of the input object, which may or may not be in contact with an input surface of the sensing region depending on the configuration. One or more light sources and/or light guiding structures may be used to direct light to the sensing region. When an input object is present, this light is reflected from surfaces of the input object, which reflections can be detect by the optical sensing elements and used to determine information about the input object.

Some optical implementations rely on principles of internal reflection to detect input objects in contact with the input surface of the sensing region. One or more light sources may be used to direct light in a transmitting medium at an angle at which it is internally reflected at the input surface of the sensing region, due to different refractive indices at opposing sides of the boundary defined by the sensing surface. Contact of the input surface by the input object causes the refractive index to change across this boundary, which alters the internal reflection characteristics at the input surface. Higher contrast signals can often be achieved if principles of frustrated total internal reflection (FTIR) are used to detect the input object. In such embodiments, the light may be directed to the input surface at an angle of incidence at which it is totally internally reflected, except where the input object is in contact with the input surface and causes the light to partially transmit across this interface. An example of this is the presence of a finger introduced to an input surface defined by a glass to air interface. The higher refractive index of human skin compared to air causes light incident at the input surface at the critical angle of the interface to air to be partially transmitted through the finger, where it would otherwise be totally internally reflected at the glass to air interface. This optical response can be detected by the system and used to determine spatial information. In some embodiments, this can be used to image small scale fingerprint features, where the internal reflectivity of the incident light differs depending on whether a ridge or valley is in contact with that portion of the input surface.

Some implementations are configured to provide images that span one, two, three, or higher dimensional spaces. The input device may have a sensor resolution that varies from embodiment to embodiment depending on factors such as the particular sensing technology involved and/or the scale of information of interest. For example, some biometric sensing implementations may be configured to detect physiological features of the input object (such as fingerprint ridge features of a finger, or blood vessel patterns of an eye), which may utilize higher sensor resolutions and present different technical considerations from some proximity sensor implementations that are configured to detect a position of the input object with respect to the sensing region (such as a touch position of a finger with respect to an input surface). In some embodiments, the sensor resolution is determined by the physical arrangement of an array of sensing elements, where smaller sensing elements and/or a smaller pitch can be used to define a higher sensor resolution.

In some embodiments, the sensor 100 is implemented as a fingerprint sensor having a sensor resolution high enough to capture features of a fingerprint. In some implementations, the fingerprint sensor has a resolution sufficient to capture minutia (including ridge endings and bifurcations), orientation fields (sometimes referred to as "ridge flows"), and/or ridge skeletons. These are sometimes referred to as level 1 and level 2 features, and in an exemplary embodiment, a resolution of at least 250 pixels per inch (ppi) is capable of reliably capturing these features. In some implementations, the fingerprint sensor has a resolution sufficient to capture higher level features, such as sweat pores or edge contours (i.e., shapes of the edges of individual ridges). These are sometimes referred to as level 3 features, and in an exemplary embodiment, a resolution of at least 750 pixels per inch (ppi) is capable of reliably capturing these higher level features.

In some embodiments, the fingerprint sensor is implemented as a placement sensor (also "area" sensor or "static" sensor) or a swipe sensor (also "slide" sensor or "sweep" sensor). In a placement sensor implementation, the sensor is configured to capture a fingerprint input as the user's finger is held stationary over the sensing region. Typically, the placement sensor includes a two dimensional array of sensing elements capable of capturing a desired area of the fingerprint in a single frame. In a swipe sensor implementation, the sensor is configured to capture to a fingerprint input based on relative movement between the user's finger and the sensing region. Typically, the swipe sensor includes a linear array or a thin two-dimensional array of sensing elements configured to capture multiple frames as the user's finger is swiped over the sensing region. The multiple frames may then be reconstructed to form an image of the fingerprint corresponding to the fingerprint input. In some implementations, the sensor is configured to capture both placement and swipe inputs.

In some embodiments, the fingerprint sensor is configured to capture less than a full area of a user's fingerprint in a single user input (referred to herein as a "partial" fingerprint sensor). Typically, the resulting partial area of the fingerprint captured by the partial fingerprint sensor is sufficient for the system to perform fingerprint matching from a single user input of the fingerprint (e.g., a single finger placement or a single finger swipe). Some example imaging areas for partial placement sensors include an imaging area of 100 mm$^2$ or less. In another exemplary embodiment, a partial placement sensor has an imaging area in the range of 20-50 mm$^2$. In some implementations, the partial fingerprint sensor has an input surface that is the same size as the imaging area.

While the input device is generally described in the context of a fingerprint sensor in FIG. 1, embodiments of the present disclosure include other biometric sensor devices. In various embodiments, a biometric sensor device may be configured to capture physiological biometric characteristics of a user. Some example physiological biometric characteristics include fingerprint patterns, vascular patterns (sometimes known as "vein patterns"), palm prints, and hand geometry.

In FIG. 1, a processing system 110 is shown in communication with the input device 100. The processing system 110 comprises parts of or all of one or more integrated circuits (ICs) and/or other circuitry components. In some embodiments, the processing system may be configured to operate hardware of the input device to capture input data, and/or implement a biometric process or other process based on input data captured by the sensor 100.

In some implementations, the processing system 110 is configured to operate sensor hardware of the sensor 100 to detect input in the sensing region 120. In some implementations, the processing system comprises driver circuitry configured to drive signals with sensing hardware of the input device and/or receiver circuitry configured to receive signals with the sensing hardware.

For example, a processing system for an optical sensor device may comprise driver circuitry configured to drive illumination signals to one or more LEDs, an LCD backlight or other light sources, and/or receiver circuitry configured to receive signals with optical receiving elements.

In some embodiments, the processing system 110 comprises electronically-readable instructions, such as firmware code, software code, and/or the like. In some embodiments, the processing system 110 includes memory for storing electronically-readable instructions and/or other data, such as reference templates for biometric recognition. The processing system 110 can be implemented as a physical part of the sensor 100, or can be physically separate from the sensor 100. The processing system 110 may communicate with parts of the sensor 100 using buses, networks, and/or other wired or wireless interconnections. In some embodiments, components composing the processing system 110 are located together, such as near sensing element(s) of the sensor 100. In other embodiments, components of processing system 110 are physically separate with one or more components close to sensing element(s) of sensor 100, and one or more components elsewhere. For example, the sensor 100 may be a peripheral coupled to a computing device, and the processing system 110 may comprise software configured to run on a central processing unit of the computing device and one or more ICs (perhaps with associated firmware) separate from the central processing unit. As another example, the sensor 100 may be physically integrated in a mobile device, and the processing system 110 may comprise circuits and/or firmware that are part of a central processing unit or other main processor of the mobile device. In some embodiments, the processing system 110 is dedicated to implementing the sensor 100. In other embodiments, the processing system 110 performs functions associated with the sensor and also performs other functions, such as operating display screens, driving haptic actuators, running an operating system (OS) for the electronic system, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes. In one or more embodiments, a first and second module may be comprised in separate integrated circuits. For example, a first module may be comprised at least partially within a first integrated circuit and a separate module may be comprised at least partially within a second integrated circuit. Further, portions of a single module may span multiple integrated circuits.

In some embodiments, the processing system 110 responds to user input (or lack of user input) in the sensing region 120 directly by causing one or more actions. Example actions include unlocking a device or otherwise changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the sensor 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, authenticate a user, and the like.

In some embodiments, the sensing region 120 of the sensor 100 overlaps at least part of an active area of a display screen, such as embodiments where the sensor 100 comprises a touch screen interface and/or biometric sensing embodiments configured to detect biometric input data over the active display area. For example, the sensor 100 may comprise substantially transparent sensor electrodes. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The display screen may also be flexible or rigid, and may be flat, curved, or have other geometries. In some embodiments, the display screen includes a glass or plastic substrate for TFT circuitry and/or other circuitry, which may be used to provide visuals and/or provide other functionality. In some embodiments, the display device includes a cover lens (sometimes referred to as a "cover glass") disposed above display circuitry which may also provide an input surface for the input device. Example cover lens materials include optically clear amorphous solids, such as chemically hardened glass, as well as optically clear crystalline structures, such as sapphire. In accordance with the disclosure, the sensor 100 and the display screen may share physical elements. For example, some embodiments may utilize some of the same electrical components for displaying visuals and for input sensing. In one embodiment, one or more display electrodes of a display device may configured for both display updating and input sensing. As another example, the display screen may be operated in part or in total by the processing system 110 in communication with the input device.

Figure 2:
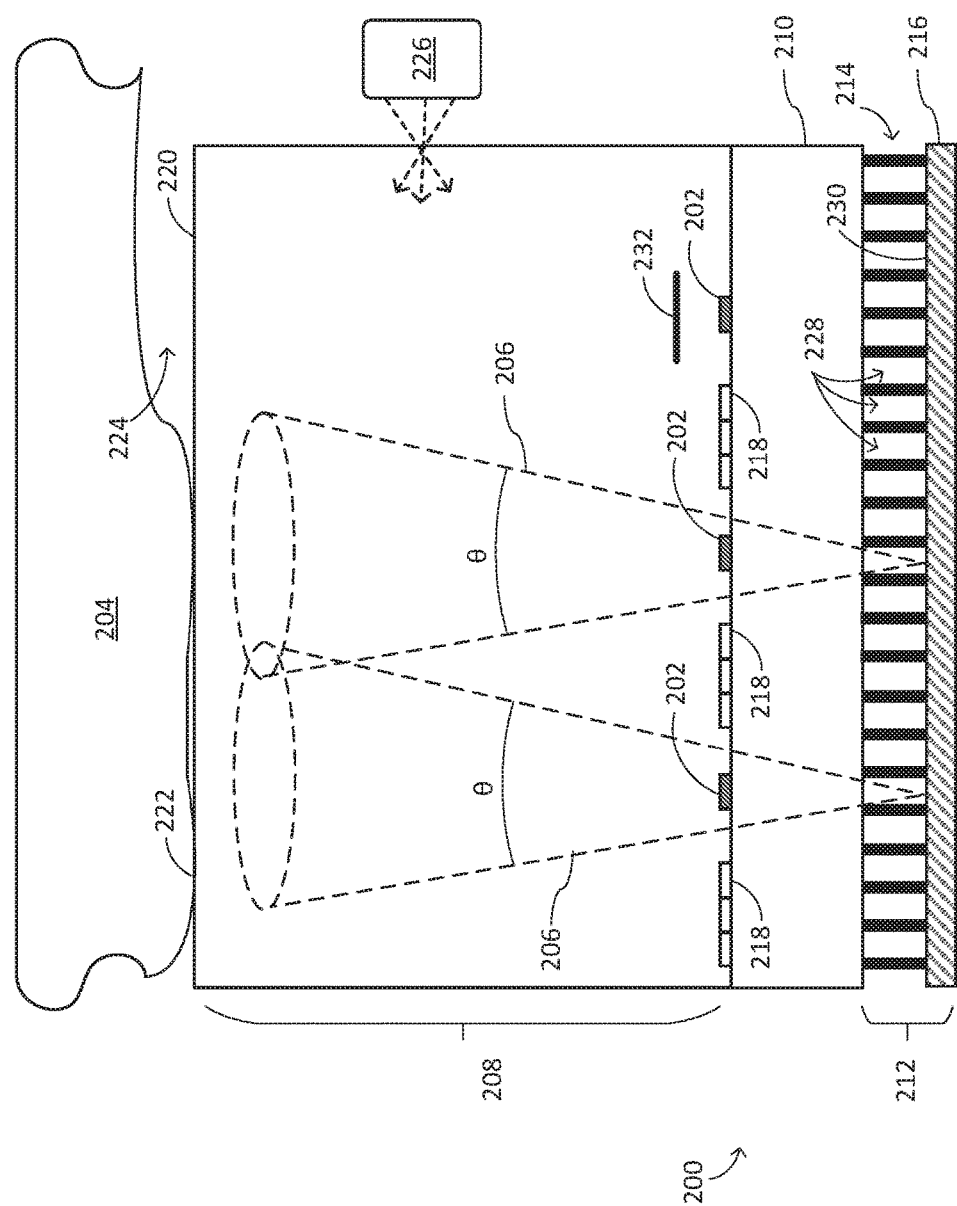
FIG. 2 illustrates an example of a sensor integrated with a display for imaging an input object, according to certain embodiments.

FIG. 2 illustrates an example of an optical sensor device 200, which may be integrated in a display. The embodiment uses photo-sensor detector elements 202 to sense an image of an input object 204 (e.g., fingerprint) placed on or near cover glass or cover lens of the display. To reduce blurring and achieve a clear image, an optical path is formed that enables sensing of light transmitted to the bottom side of detector element 202 (opposite side of the input object to be imaged). The optical path for each detector element 202 is represented by an acceptance cone 206 having an acceptance angle θ and includes a transmission path through a cover layer 208, through transparent substrate 210, before entering an angle selective reflector 212. The angle selective reflector 212 includes reflective layer 216 and may include baffles 214. High angle light (large angle with respect to normal) entering the angle selective reflector 212 is absorbed by walls in baffles 214 and/or is filtered out by reflective layer 216. Low angle light (small angle with respect to normal) reaches the reflective layer 216 and is reflected back up towards the substrate 210 and at least some of the reflected light reaches and is detected at the detector elements 202. The baffles 214 limit the optical path to the acceptance cone of light 206 with a relatively small acceptance angle. The acceptance cone may further limited by a size, e.g. width, of the detector element 202. Maintaining a small acceptance angle, and thus minimizing blurring, is realized by the disclosed embodiments. The sensor 200 also includes various display elements 218, which may produce varying colors and are used to provide a graphical display visible to a user.

The cover layer 208 is typically provided as part of the display to protect inner components of the display such as the detector elements 202 and the display elements 218. A top surface 220 of the cover layer 208 forms a sensing surface, which provides a contact area for the input object 204. It will be understood that the sensing surface 220 forms part of a sensing region in which an object may be imaged. As previously described, the sensing region may extend above the actual sensing surface 220. For simplicity, the cover layer 208 is shown as a single layer. However, the cover layer may include multiple layers or lenses, and may also include additional components, which vary depending on the type of display technology utilized.

Although generally described in the context of a fingerprint for illustrative purposes, the input object 204 is any object to be imaged. Generally, the object 204 will have various features. By way of example, the object 204 has ridges 222 and valleys 224. Due to their protruding nature, the ridges 222 contact the sensing surface 220. The valleys 224 may not contact the sensing surface 220 and instead form an air gap between the input object 204 and the sensing surface 220. These features may be optically imaged using direct illumination or by relying on principles of internal reflection.

In the examples shown in FIG. 2, the detector elements 202 and the display elements 218 are positioned above a substrate 210. The substrate 210 is made of transparent (including semitransparent) material. The substrate 210 may be selectively transparent to certain wavelengths, e.g., allowing certain wavelengths of light to pass through while blocking, attenuating or absorbing other wavelengths. Although the detector elements 202 and display elements 218 are generally shown in the same plane, the detector elements 202 and display elements 218 may be positioned in different planes.

The detector elements 202 are any suitable type of photo detector, which are configured to detect light from below. Examples of suitable detector elements are complementary metal oxide semiconductor (CMOS) and charge coupled device (CCD) sensor arrays. The detector elements 202 may be constructed as thin film transistors (TFTs) and/or thin film photo detectors (TFDs) such as pn and pin diodes. The display elements 218 may include any type of light source used in typical displays such as light emitting diodes (LEDs) and organic LEDs (OLEDs), for example. In certain embodiments, each of the display elements 218 may be a display sub-pixel (e.g., red, green, blue) or may be an element of a pixel.

In certain embodiments, the display elements 218 form a source of light, used to transmit light to the sensing surface 220, which is then reflected and detected by the detector elements 202 as described further below. However, it will be understood that a separate light source, such as light source 226 may be used in place of, or in combination with, the display elements 218 to provide the source of light.

Figure 3:
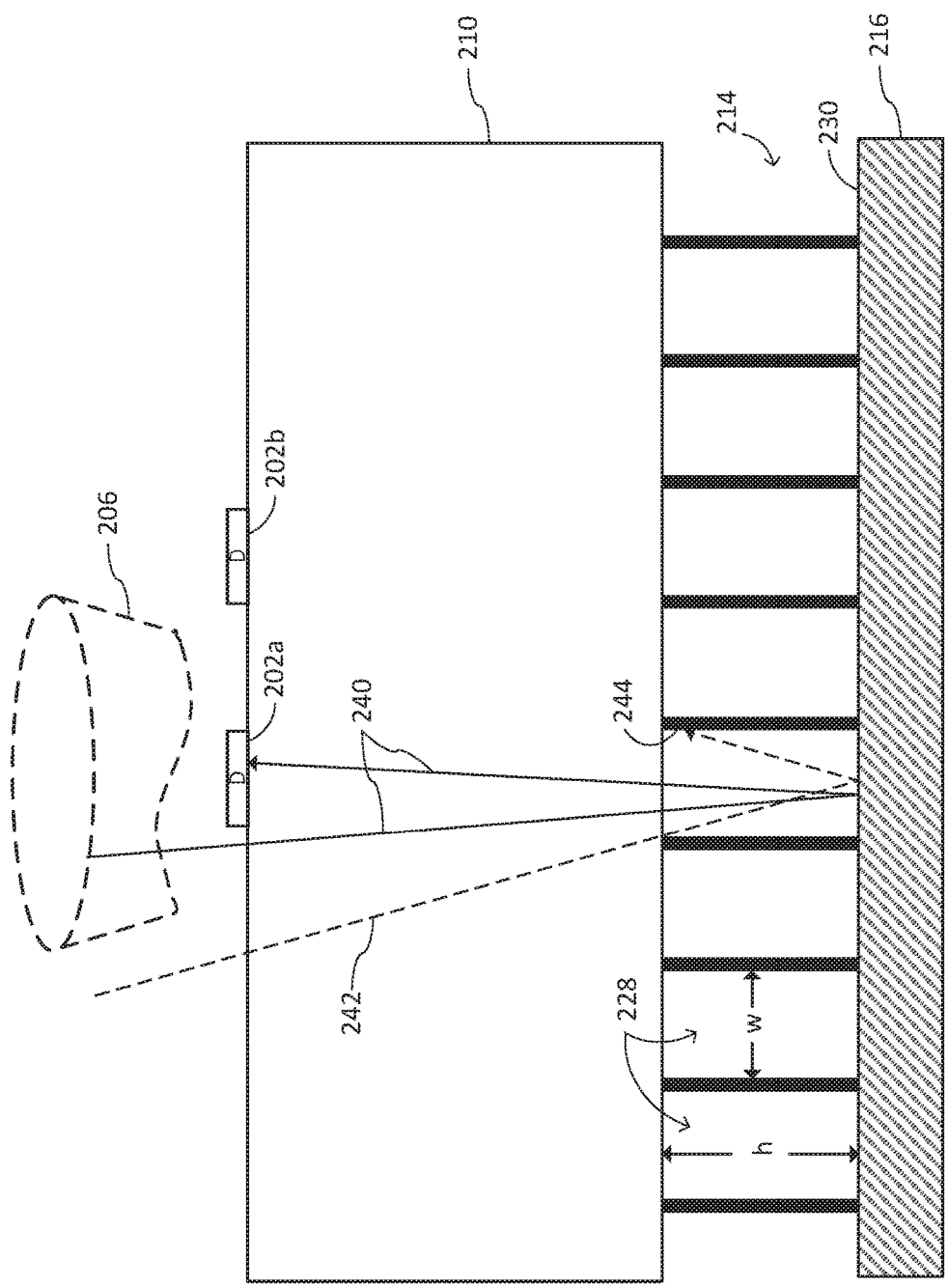
FIG. 3 illustrates an example of a sensor integrated with a display for imaging an input object, according to certain embodiments.

The baffles 214 are configured to restrict the angle θ of the acceptance cone 206 with the angle being dependent upon an aspect ratio of the baffles, wherein the aspect ratio is the ratio of the height of the baffle walls (h) to the distance between walls or width (w) of baffle openings 228 (FIG. 3). The spaces forming baffle openings 228 are configured to permit the transmission of light and can be air or any suitable material transparent to the light being used for optical detection. The walls of the baffles 214 may be made of light absorbing material. The baffle walls are shown as running from the substrate 210 to the reflective layer 216; however, the walls may be shorter, i.e. may not cover the entire distance between the substrate 210 and the reflective layer 216. Moreover, although the baffle walls are depicted as straight, they may be curved or angular.

The reflective layer 216 is positioned below the baffles 214 and includes a reflective surface 230. The reflective surface 230 is configured to reflect light and may be constructed, for example, as a continuous or discrete set of mirrored surfaces. Further, the reflective surfaces 230 may have a variety shapes such as, for example, flat, curved, and prismatic.

In accordance with the arrangement described, the direction of light entering a given detector element 202 is restricted to a corresponding acceptance cone 206 having a small acceptance angle θ as shown in FIG. 2 to prevent blurring of the image of the input object 204. The acceptance cone 206 may, for example, be limited to a few degrees. The acceptance angle θ determines the degree of image blurring and the maximum distance from the detector elements 202 that the input object 204 can be located while still achieving a given image resolution. The size of the acceptance cones 206 is dependent upon the aspect ratio of the openings 228 in the baffle 214, the structure and reflective properties of the reflective layer 216 and/or the width of the detector elements 202.

The detector elements 202 detect light, which is reflected from the sensing surface 220 and/or the input object 204 and which falls within the acceptance cone 206. Such light is transmitted through the cover layer 208 and the transparent substrate 210, and through baffle openings 228, which light is then at least partially reflected off the reflective surfaces 230 and up to the detector elements 202. Light which falls outside of a particular acceptance cone 206 is generally prevented from reaching the corresponding detector element 202 because such light will either be blocked by the walls of the baffles 214, filtered by the reflective layer 214 or because the light falls in an acceptance cone corresponding to another detector element.

In certain embodiments, a light shield 232 is provided above the detector elements 202. The light shield 232 prevents light reflected at the sensing surface 220 from directly reaching the detector elements 202.

For purposes of illustration, only a limited number of detector elements 202 and corresponding acceptance cones are shown. It will be appreciated that the sensor 200 will have as many such detector elements 202 as needed to image a desired area of the input object 204 and each detector element 202 will have a corresponding acceptance cone. Further, in the example, one detector element 202 is shown for a set of display elements 218 of the display. However, the detector element pitch need not match the display element pitch, e.g., each pixel or set of sub-pixels need not have a corresponding detector element. Moreover, detector elements may be staggered in arrangement throughout the display to minimize the reception of stray light.

The combination of the baffles 214 and the reflective surface 230 narrows the angle of the light incident on the detector element and, thus, also restricts the light from specific areas on the input object that reaches each detector element. The width and the height of the baffle 214 array determines the acceptance angle θ. The corresponding area that is sampled by the detector depends on the thickness of particular display components, i.e. optical path between the input object 204 and the detector elements 202. Higher ratios allowing for finer sampling of the input object or imaging thru thicker display components. Of course, any aspect ratio may be used depending on the resolution and quality of image desired as well as the overall dimensions of the display components. Also, different aspect ratios may be used to achieve the same given optical resolution depending on the design of the optical system. For example, an aspect ratio of the baffle array may be lower if it is combined with curved mirrors, such in FIG. 4 below, than if it is combined with a flat mirror.

FIG. 3 illustrates a view showing the acceptance of light from a small area of the input object generally above the detector element 202a that is within the acceptance cone 206 while light outside the acceptance cone 206 is blocked or absorbed by the baffle arrangement 214. Depicted in the figure are detector elements 202a, 202b, transparent substrate 210, baffles 214, and reflective layer 216 having reflective surface 230. Also shown is a portion of acceptance cone 206.

Light ray 240 represents a beam of light which is reflected from the input object 204 at the sensing surface 220 and which falls within the acceptance cone 206. Due to its relatively small angle, light ray 240 passes through the transparent substrate 210, through the baffles 214, is reflected off reflective surface 230 and reaches the underside of detector element 202a.

Light ray 242 also represents a beam of light which is reflected from the input object 204 at the sensing surface 220. However, light ray 242 is reflected at a relatively high angle and consequently falls outside of the acceptance cone 206. The angle of light ray 242 is sufficiently small to reach the reflective surface 230, but due to the angle of reflection, the light ray 242 strikes a sidewall 244 of the baffle 214. The light ray 242 is absorbed by the sidewall 244 thereby preventing the light ray 242 from reaching a plane of the detector elements and possibly forming a stray light beam reaching, for example, detector element 202b.

The arrangement prevents high angle light from outside of the acceptance cone 206 from reaching detector elements. Thus, the light reaching a particular detector element is generally limited to light from a region of the input object near directly above the detector element thereby minimizing blurring.

Figure 4:
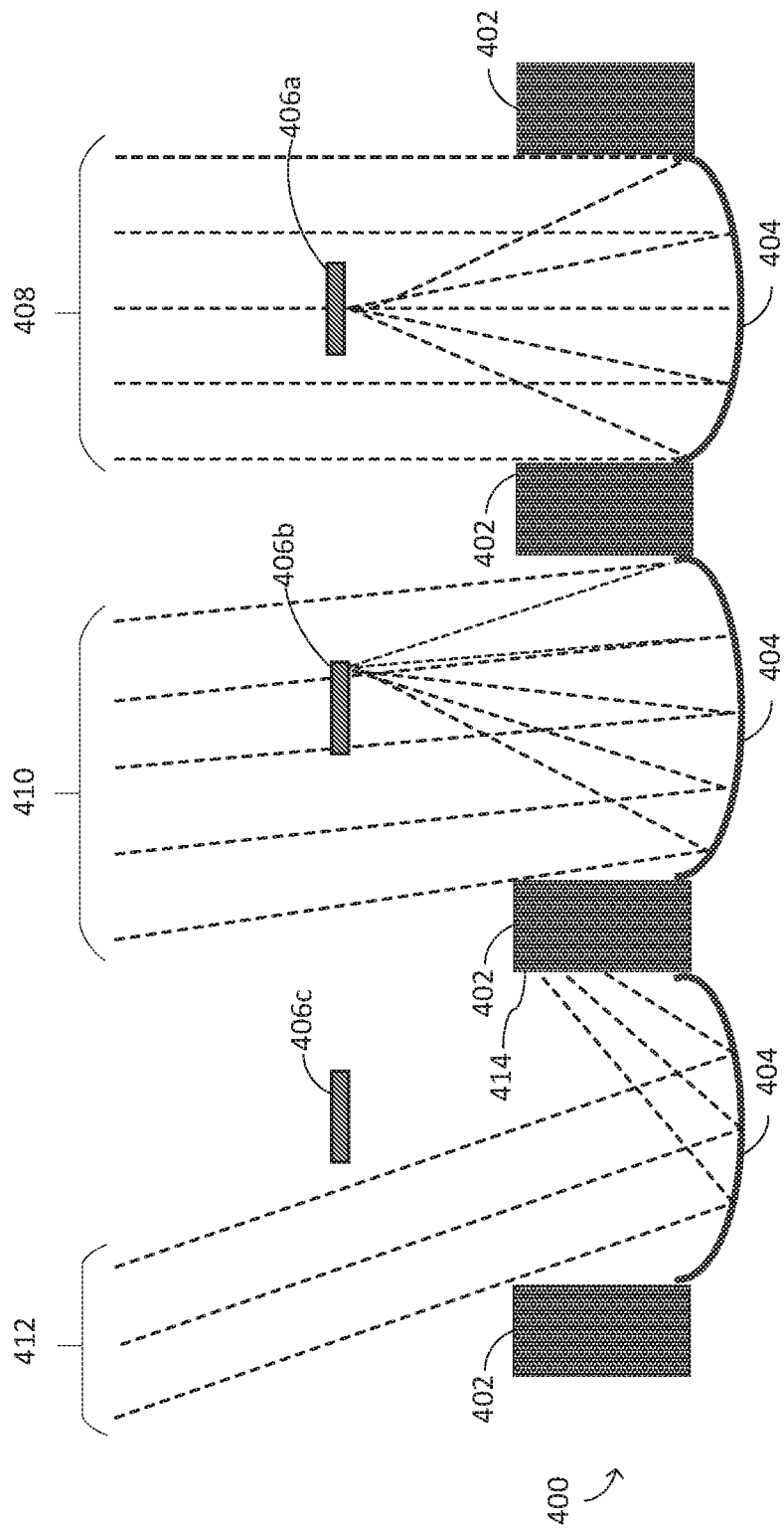
FIG. 4 illustrates an example of an angle selective reflector with curved surfaces, according to certain embodiments.

FIG. 4 illustrates an example of an angle selective reflector 400 which may be used in certain embodiments and illustrates the interaction of the selective reflector with normal light 408, low angle (near normal) light 410 and high angle light 412. The angle selective reflector 400 includes baffles 402 and curved reflective surfaces 404. The curved reflective surfaces 402 may have a variety geometries including, for example, parabolic, elliptical circular or semicircular, ashperical, and may be full size or ring shaped. Disposed above the curved surfaces 404 and the baffles 402 are detector elements 406a, 406b and 406c.

As shown, light rays 408 are directed straight down (normal) relative a plane defining the detector elements. When the light rays 408 strike the reflective surface 404, the light rays 402 are reflected back up towards the plane of the detector elements. The relative angle of the reflected light will vary depending on the curvature of the reflective surfaces 404. In the case of a parabolic reflective surface, the light rays 402 are reflected back toward a focal point relative to the curved surfaces 404. The detector element 406a may thus be positioned proximate to the focal point to receive a maximum amount of the reflected normal light.

As another example, light rays 410 reach the angle selective reflector 400 from a small angle relative to normal. As such, the light rays 410 do not exactly converge on the focal point of the reflective surfaces 204. Nevertheless, detector element 406b still receives the off angle light rays 410. It will also be appreciated that for this reason, the detector elements 406 need not be directly aligned with the center of the reflective surfaces and baffle walls since the detector element will still receive some light such as light rays 410. Put another way, an advantage of the disclosed embodiments is that the angle selective reflector need not be perfectly aligned with the detector elements for imaging of an input object.

Light rays 412 illustrate relatively high (wide) angle light, which fall outside of the acceptance cone corresponding to detector element 406c. When the light rays 412 strike the reflective surface 404 they are reflected at a relatively large angle. Thus, as shown, the light rays 412 strike the wall 414 of the baffle 402 and are absorbed, preventing cross-talk between adjacent detector pixels.

Figure 5A:
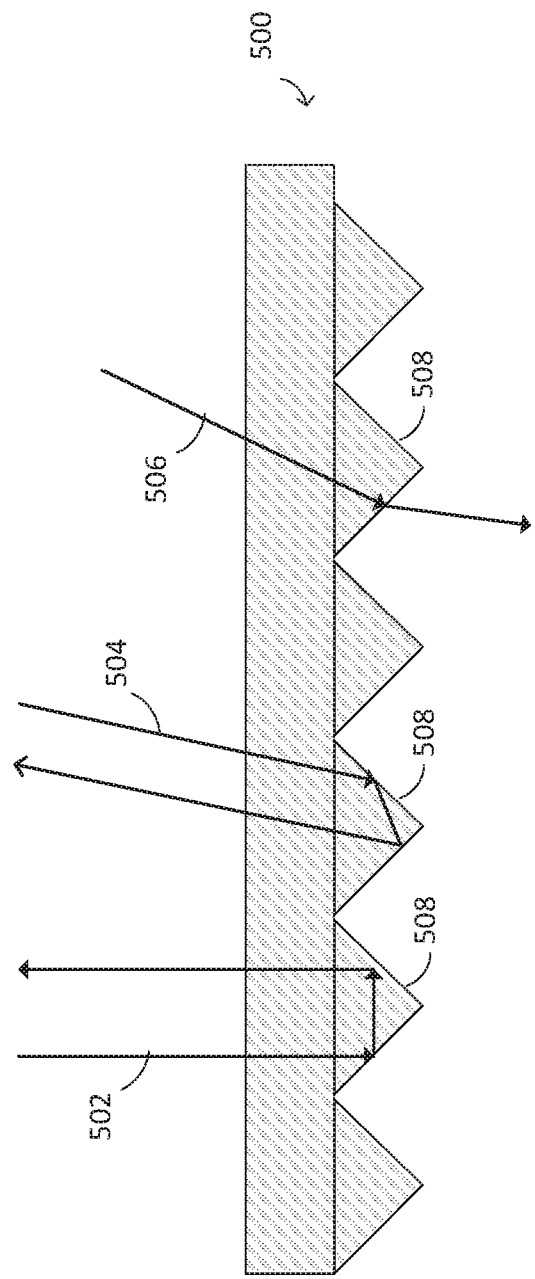
FIGS. 5A-5B illustrates examples of a reflective surfaces, according to certain embodiments.

FIG. 5A illustrates a retro-reflector array film 500 which may be used in certain embodiments as the reflective layer formed beneath the baffles (not shown). In this embodiment, the reflective layer is formed by a prism array film. The arrangement 500 can be used to filter out higher angle light.

For example, light ray 502 (which has a near normal angle) becomes incident on the reflector 500 at the prismatic surfaces 508. The light ray 502 is reflected back up along a parallel path to the incident light as shown. Similarly, light ray 504, which although not normal is incident on the prismatic surfaces 508 at a small angle, is also reflected back up along a parallel path.

In contrast, light reaching the reflector 500 at larger angles, such as shown by light ray 506 largely pass through the prismatic surfaces 508. Thus, the retro-reflector 500 filters out larger angle light without requiring high baffles. However, it will be understood that baffles may still be used to remove stray light.

Figure 5B:
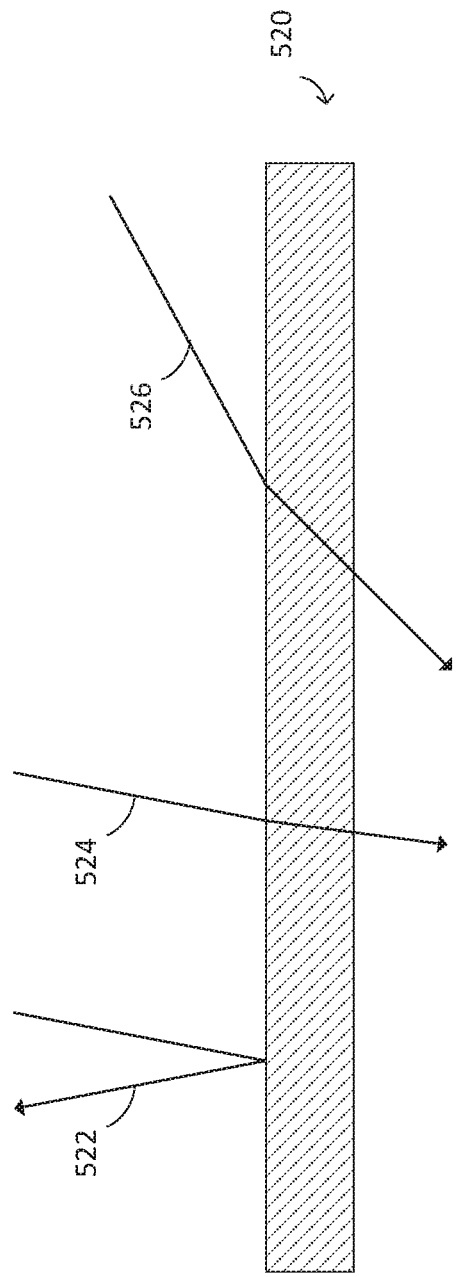

FIG. 5B illustrates a reflective layer in the form of a dichroic reflector and/or dielectric stack 520. A dichroic reflector reflects light of certain wavelengths while passing other wavelengths. By using a dichroic reflector, certain color or colors, e.g., blue light, can be used for the imaging process while the reflector passes other light such as red and green. A dielectric mirror is made of multiple thin layers of dielectric material that may, for example, be deposited on a substrate of glass or other material. Based on the type of thickness of dielectric layers, the reflector can be designed with specific reflectivity for different wavelengths of light.

Thus, for example, light ray 522 of a certain color (e.g., red) becomes incident on the reflective layer 520 and is reflected off of the surface of the reflective layer. Light ray 524 of a different color (e.g. blue) becomes incident on the reflective layer 520 at nearly the same angle as light ray 522, but passes through the reflective layer. Alternatively, and or in combination with the foregoing, light ray 526 becomes incident on the reflective layer 520 at a relatively large angle compared to normal and passes through the reflective layer. In this manner, the reflective layer can be designed to create a narrow acceptance cone for selective wavelength range without the need for baffles.

Figure 6A:
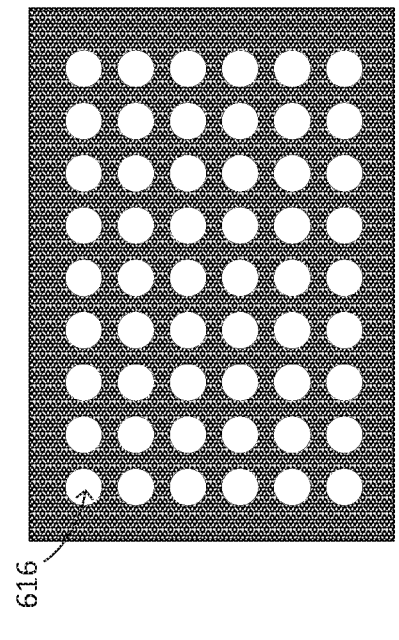
FIGS. 6A-6C illustrate examples of baffle arrangements, according to certain embodiments.
Figure 6B:
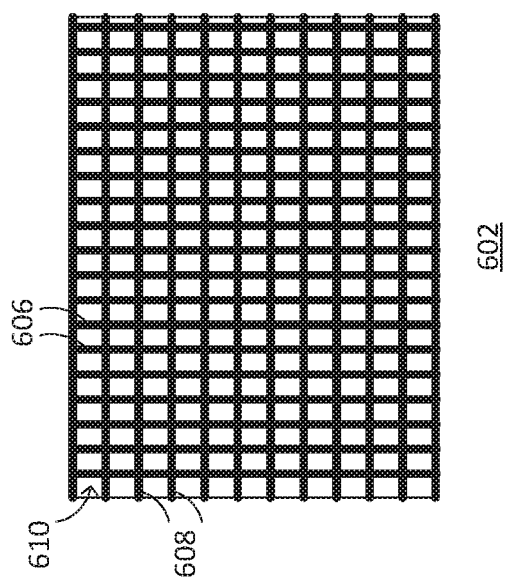

FIGS. 6A-6B illustrate plan views of the baffles 602 and 604 according to different embodiments. As shown in FIG. 6A, the baffles 602 have a first set of walls 606 and a second set of walls 608 wherein the second set of walls are orthogonal to the first set of walls. In the example, the walls form gaps 610 having a generally rectangular or square cross section. In FIG. 6B, the baffles 604 form gaps 616 having a circular cross section. As previously described, the gaps 610 and/or 616 may be filled with air or may be filled with transparent or semitransparent material. Further, it will be understood that the geometries for the baffles in FIGS. 6A-6B shown are by way of the example only. The cross section of the gaps may form any geometry, including polygons of varying shapes, ellipses and the like. Moreover, the cross sections may form irregular shapes and need not be uniformly distributed.

Figure 6C:
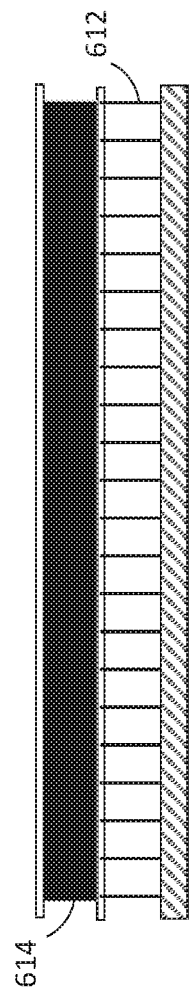

The baffles may be formed by deposition of material, molding etc. in the arrangement shown, or by etching or trenching holes in the absorbing material. Alternatively, as shown in FIG. 6C, the baffles may be formed as two 1D layers with one layer stacked on top of the other. A first 1D layer is formed with a set of walls 612 running in a first direction. Then a second 1D layer is formed with a set of walls 614 orthogonal and stacked on top of the first set of walls 612.

The baffles can also be made by process similar to drawing optical fiber arrays where each fiber has a cladding layer or an absorbing layer around the fiber. If the fiber is transparent, the fiber can remain. Alternatively, the fiber can be removed leaving the absorbing layer.

Although certain of the embodiments herein have been described as using a baffle arrangement, it will be understood that the baffles are not required. For example, embodiments using a dichroic reflector and/or dielectric stack may eliminate the need for a baffle arrangement.

Figure 7:
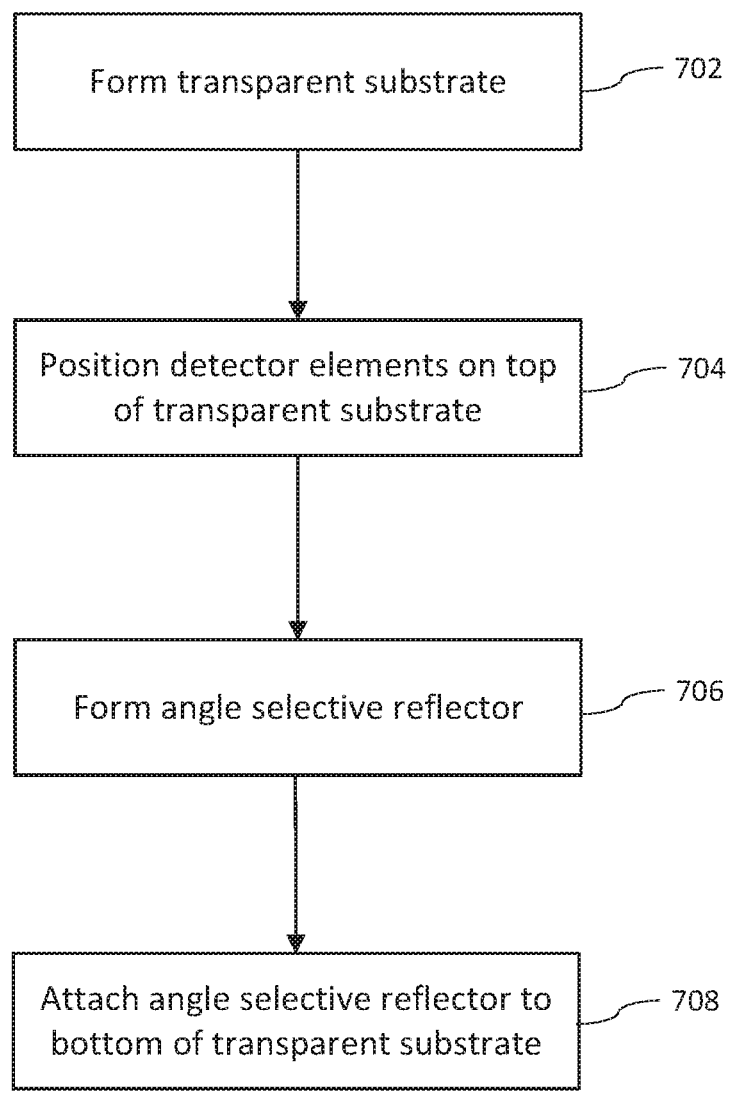
FIG. 7 illustrates an example of a method of making a sensor integrated with a display, according to certain embodiments.

FIG. 7 illustrates an example of a method for making sensor arrangement including detector elements, a transparent layer, and an angle selective reflector according to the disclosure. Although the steps are described in a particular sequence, the sequence may be altered and/or steps may be combined or eliminated without departing from the scope of the disclosure except where otherwise apparent.

In step 702, a transparent substrate is formed having a first side (top side) and a second (bottom side). In step 704, an array of detector elements is formed above the top side of the substrate.

In step 706, the angle selective reflector is formed. The angle selective reflector includes a reflective layer and may include baffles, which may be constructed of light absorbing material. In embodiments with baffles, the baffles can be manufactured in multiple ways. In one embodiment, the baffles are manufactured by etching holes or trenches in silicon (Si) or other high absorbing compound wafers, similar to a through silicon via (TSV) process used in semiconductor fabrication. In another embodiment, the baffles are manufactured by selectively depositing or etching thick absorbing layers on a glass or plastic substrate, which can be done in one or multiple steps in order to create a pattern with the desired aspect ratio. In another embodiment, the baffles manufactured by injection molding, embossing or thermoforming material such as silicones or other resins loaded with absorbing dyes or particles.

In order to capture a 2D image, the baffles should limit the angle in all azimuthal directions, and hence should have a 2D arrangement, such as is shown in FIGS. 6A and 6B. As previously noted, the geometries shown in FIGS. 6A and 6B are by way of example only and any suitable geometry may be used. Two 1D layers can be stacked on top of each other, e.g., two 1D (linear array) patterns stacked on top of each other in orthogonal directions as shown in FIG. 6C.

In step 708, the angle selective reflector is attached to the bottom side of the transparent substrate using any suitable means. As one example, the angle selective reflector is attached to the substrate using optically clear adhesive. The baffles, and angle selective reflector generally, may also be formed directly onto the transparent substrate.

In illustrating the various embodiments, examples have been shown where the pitch size of the detector elements is generally the same as the pitch size of the display elements. However, it will be understood that the pitch of the detector elements and display elements may be different. In addition, it will be understood that the arrangement of apertures and/or detector pixels may be staggered throughout a display to the further reduce the possibility of noise reaching the detector elements. Detector elements that are susceptible to receiving stray light or noise may be eliminated for simply not used during the imaging process.

It will further be understood that arrangement has generally been described in the context of a sensor for imaging an object. However, the sensor described herein can also be used as a touch sensor.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosure (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate, and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. An optical sensor for imaging a biometric input object in a sensing region, comprising:
   a set of display elements and an array of detector elements positioned below the sensing region, wherein the array of detector elements is positioned to detect light incident from below the array of detector elements;

a baffle arrangement positioned below the set of display elements and the array of detector elements, wherein the baffle arrangement includes an array of openings positioned to collimate light incident from below the baffle arrangement; and a reflective layer positioned below the baffle arrangement, the reflective layer positioned to reflect light towards the array of detector elements.

2. The optical sensor of claim 1, wherein the baffle arrangement comprises a light absorbing material.

3. The optical sensor of claim 2, wherein the array of openings comprises a transparent material.

4. The optical sensor of claim 2, wherein the array of openings comprises a semitransparent material.

5. The optical sensor of claim 1, wherein the array of openings have a rectangular cross section.

6. The optical sensor of claim 1, wherein the array of openings have an elliptical or circular cross section.

7. The optical sensor of claim 1, wherein the reflective layer comprises a plurality of reflectors arranged to direct light to the detector elements.

8. The optical sensor of claim 7, wherein the plurality of reflectors are one of parabolic, spherical, aspherical or elliptical.

9. The optical sensor of claim 1, wherein the reflective layer comprises a dichroic reflector configured to reflect first light of a first range of wavelengths and pass second light of a second range of wavelengths.

10. The optical sensor of claim 1, wherein the set of display elements and the array of detector elements are positioned in the same plane.

11. The optical sensor of claim 1, further comprising:
a light shield positioned between the sensing region and the array of detector elements.

12. The optical sensor of claim 1, wherein the baffle arrangement comprises:
a substrate;
a first set of sidewalls positioned on the substrate and formed from a light absorbing material; and
a second set of sidewalls positioned above the substrate and formed from the light absorbing material; the first set of sidewalls and the second set of sidewalls forming the array of openings.

13. The optical sensor of claim 12, wherein the reflective layer is formed on the substrate.

14. The optical sensor of claim 12, wherein the first set of sidewalls are positioned in a first layer and the second set of sidewalls are positioned in a second layer, the second layer being above the first layer.

15. The optical sensor of claim 12, wherein the array of openings comprise a transparent material.

16. A display for imaging a biometric input object in a sensing region, comprising:
a transparent substrate having a first side and a second side opposite the first side, wherein the transparent substrate is positioned below the sensing region;
a set of display elements positioned above the first side of the transparent substrate, the set of display elements providing illumination for the imaging the biometric input object;
an array of detector elements positioned above the first side of the transparent substrate, wherein the array of detector elements is positioned to detect light incident from below the array of detector elements;
a baffle arrangement positioned below the set of display element, wherein the baffle arrangement is formed of light absorbing material and wherein the light absorbing material includes gaps defining an array of apertures positioned to collimate light incident from below the baffle arrangement; and
a reflective layer positioned below the baffle arrangement, the reflective layer positioned to reflect light towards the array of detector elements.

17. The display of claim 16, wherein the baffle arrangement comprises sidewalls forming the array of apertures and wherein the sidewalls are straight.

18. The display of claim 16, wherein the baffle arrangement comprises sidewalls forming the array of apertures and wherein the sidewalls are angular.

19. The display of claim 16, wherein the baffle arrangement comprises:
a first layer, the first layer comprising first sidewalls made of the light absorbing material orientated in a first direction; and
a second layer, the second layer comprising second sidewalls made of the light absorbing material orientated in a second direction, wherein the second layer is positioned above the first layer and wherein the second direction is different from the first direction.

20. The display of claim 16, wherein the set of display elements and the array of detector elements are positioned in the same plane.

* * * * *